(12) United States Patent
Sakai

(10) Patent No.: US 8,384,836 B2
(45) Date of Patent: Feb. 26, 2013

(54) LIQUID CRYSTAL DISPLAY DEVICE

(75) Inventor: Takeshi Sakai, Kokubunji (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 91 days.

(21) Appl. No.: 12/828,748

(22) Filed: Jul. 1, 2010

(65) Prior Publication Data

US 2011/0001897 A1  Jan. 6, 2011

(30) Foreign Application Priority Data

Jul. 3, 2009 (JP) ................... 2009-159169

(51) Int. Cl.
*G02F 1/1368* (2006.01)

(52) U.S. Cl. ............................. 349/43; 349/46

(58) Field of Classification Search .................. None
See application file for complete search history.

(56) References Cited

U.S. PATENT DOCUMENTS

| | | | | |
|---|---|---|---|---|
| 4,990,981 A * | 2/1991 | Tanaka et al. | ................. | 349/43 |
| 5,471,330 A * | 11/1995 | Sarma | ............................ | 349/43 |
| 5,614,731 A * | 3/1997 | Uchikoga et al. | ............. | 257/59 |
| 6,274,884 B1 * | 8/2001 | Lee et al. | ........................ | 257/57 |
| 6,476,418 B1 * | 11/2002 | Shiga et al. | ...................... | 257/72 |
| 6,917,392 B2 * | 7/2005 | Hannuki et al. | ................. | 349/43 |
| 2001/0052951 A1 * | 12/2001 | Ashizawa et al. | ............... | 349/43 |
| 2004/0001167 A1 * | 1/2004 | Takeuchi et al. | ................ | 349/38 |

FOREIGN PATENT DOCUMENTS

JP  05-313192  11/1993

\* cited by examiner

*Primary Examiner* — Mike Stahl
(74) *Attorney, Agent, or Firm* — Antonelli, Terry, Stout & Kraus, LLP.

(57) ABSTRACT

A liquid crystal display device having thin film transistors which can alleviate the required alignment accuracy of a semiconductor film while suppressing the generation of an optical leak current is provided. The liquid crystal display device includes: a transparent substrate; gate electrodes which are stacked above the transparent substrate; source electrodes and drain electrodes which are stacked above the gate electrodes; and semiconductor films each of which is stacked above the gate electrode and controls an electric current between the source electrode and the drain electrode based on an electric field generated by the gate electrode, wherein the semiconductor film is formed into a planar shape, and includes a first region which overlaps with the gate electrode in plane and a second region which does not overlap with the gate electrode in plane, and the source electrode and the drain electrode are not connected to the semiconductor film in the second region, and are connected to the semiconductor film in the first region.

7 Claims, 10 Drawing Sheets

LIQUID CRYSTAL DISPLAY DEVICE

The present application claims priority from Japanese application JP 2009-159169 filed on Jul. 3, 2009, the content of which is hereby incorporated by reference into this application.

BACKGROUND OF THE INVENTION

1. Field of the Invention

The present invention relates to a liquid crystal display device which displays an image by allowing light from a backlight to pass through a substrate on which thin film transistors (TFTs) are formed.

2. Description of the Related Art

In a liquid crystal display device, there has been known an active-matrix-type liquid crystal display device which performs a display control of pixels using thin film transistors (TFTs). Such a liquid crystal display device is constituted of a liquid crystal panel including a TFT substrate on which thin film transistors are formed in a matrix array, and a backlight which supplies light to the liquid crystal panel.

As the device structure of the thin film transistor, there has been a bottom gate structure in which a gate electrode is arranged below a semiconductor film made of amorphous silicon (a-Si), polycrystalline silicon (poly-Si) or the like. FIG. 9A is a plan view showing one example of a thin film transistor having the conventional bottom-gate structure, and FIG. 9B is a cross-sectional view of the thin film transistor shown in FIG. 9A. As shown in FIG. 9B, a gate electrode GT is arranged on a transparent substrate GA and, further, a semiconductor film AS is formed over the gate electrode GT.

FIG. 10A is a plan view showing one example of a thin film transistor having the conventional bottom-gate structure, and FIG. 10B is a cross-sectional view of the thin film transistor shown in FIG. 10A. As shown in FIG. 10A, a semiconductor film AS is formed inside the gate electrode GT as viewed in a plan view, and the semiconductor film AS is shielded from light of a backlight radiated from a side below a transparent substrate GA. Accordingly, such a thin film transistor shown in FIG. 10A can suppress the occurrence of an optical leak current which deteriorates image quality of a liquid crystal display device.

JP-A-5-313192 discloses, as shown in FIG. 12 and the like in the same document, a thin film transistor where the whole semiconductor film is shielded from light of a backlight by a gate electrode.

SUMMARY OF THE INVENTION

Here, in case of the thin film transistor shown in FIG. 9A and FIG. 9B, the semiconductor film is not completely shielded from light radiated from the backlight by the gate electrode and hence, an optical leak current is generated whereby there exists a possibility that image quality is deteriorated. On the other hand, in case of the thin film transistor shown in FIG. 10A and FIG. 10B, although the generation of an optical leak current can be suppressed, since it is necessary to arrange the semiconductor film inside the gate electrode, the required alignment accuracy becomes strict. Although the required strict alignment accuracy can be alleviated by increasing a width of the gate electrode, for example, this increase of the width of the gate electrode lowers a numerical aperture.

The invention has been made in view of such drawbacks, and it is an object of the invention to provide a liquid crystal display device having thin film transistors which can alleviate the required alignment accuracy of a semiconductor film while suppressing the generation of an optical leak current.

To overcome the above-mentioned drawbacks, according to one aspect of the invention, there is provided a liquid crystal display device having thin film transistors which includes: a transparent substrate; gate electrodes which are stacked above the transparent substrate; source electrodes and drain electrodes which are stacked above the gate electrodes; and semiconductor films each of which is stacked above the gate electrode and controls an electric current between the source electrode and the drain electrode based on an electric field generated by the gate electrode, wherein the semiconductor film is formed into a planar shape, and includes a first region where the semiconductor film overlaps with the gate electrode in plane and a second region where the semiconductor film does not overlap with the gate electrode in plan view, and the source electrode and the drain electrode are not connected to the semiconductor film in the second region, and are connected to the semiconductor film in the first region.

According to one mode of the liquid crystal display device of the invention, a gate insulation film may be stacked between the gate electrode and the semiconductor film, the semiconductor film may be stacked above the gate insulation film in a contact manner, and the source electrode and the drain electrode may be stacked above the gate electrode such that the source electrode and the drain electrode are brought into contact with the gate insulation film and climb over the semiconductor film from a side of the semiconductor film.

According to one mode of the liquid crystal display device of the invention, the gate electrode may include an extending portion which extends from a portion thereof which overlaps with the first region in plane without overlapping with the semiconductor film in plan view, and the source electrode and the drain electrode may be connected to the semiconductor film in the first region by way of a region where the source electrode and the drain electrode overlap with the extending portion in plan view.

According to one mode of the liquid crystal display device of the invention, the source electrode and the drain electrode may extend along the gate electrode and may overlap with the extending portion and the first region in plan view.

According to one mode of the liquid crystal display device of the invention, the gate electrode may be formed in a projecting manner in the Y direction perpendicular to an X direction from a gate signal line which is formed in the X direction and to which a scanning signal is supplied, the extending portion may further extend from a portion of the gate electrode which overlaps with the first region of the semiconductor film in the direction where the gate electrode projects, and the source electrode and the drain electrode may extend toward the gate electrode from a position which is more away from an end portion of the gate electrode in the direction that the gate electrode projects, and may overlap with the extending portion and the first region in plan view.

According to one mode of the liquid crystal display device of the invention, the liquid crystal display device may further includes: gate signal lines which are formed in the X direction and to which a scanning signal is supplied; and drain signal lines which are formed in the Y direction perpendicular to the X direction and to which a video signal is supplied, wherein the drain electrode may constitute a portion of the drain signal line, and the drain signal line may have a portion which overlaps with the gate electrode and the semiconductor film in plan view, the first region of the semiconductor film may be sandwiched by the extending portions of the gate electrode from both sides in the Y direction, and the drain signal line may extend to the first region of the semiconductor film from both sides in the Y direction, and may have a portion thereof connected to the semiconductor film.

According to one mode of the liquid crystal display device of the invention, a backlight may be arranged below the transparent substrate, the first region may be shielded from light radiated from the backlight by the gate electrode, and a region to which an electric field is applied due to a potential difference between the source electrode and the gate electrode and between the drain electrode and the gate electrode may be positioned away from the second region which is not shielded from light radiated from the backlight.

According to one mode of the liquid crystal display device of the invention, the source electrode and the drain electrode may be connected to the semiconductor film in the first region while preventing the source electrode and the drain electrode from overlapping with the second region in plan view.

According to the invention, it is possible to provide a liquid crystal display device having thin film transistors which can alleviate the required alignment accuracy in forming the semiconductor film while suppressing the generation of an optical leak current.

DESCRIPTION OF THE PREFERRED EMBODIMENTS

[First Embodiment]

Hereinafter, a first embodiment of the invention is explained in conjunction with drawings. A display device according to this embodiment is an IPS (In-Plane Switching)-type liquid crystal display device. The liquid crystal display device includes: a TFT substrate on which scanning signal lines (gate signal lines), video signal lines (drain signal lines), thin film transistors, pixel electrodes, and counter electrodes are arranged; a color filter substrate which faces the TFT substrate in an opposed manner and forms color filters thereon; liquid crystal material which is hermetically filled in a region sandwiched between both substrates; and a backlight which supplies light to the TFT substrate and the color filter substrate. The TFT substrate is configured such that the thin film transistors are arranged on a transparent substrate made of glass or the like in a matrix array.

Figure 1:
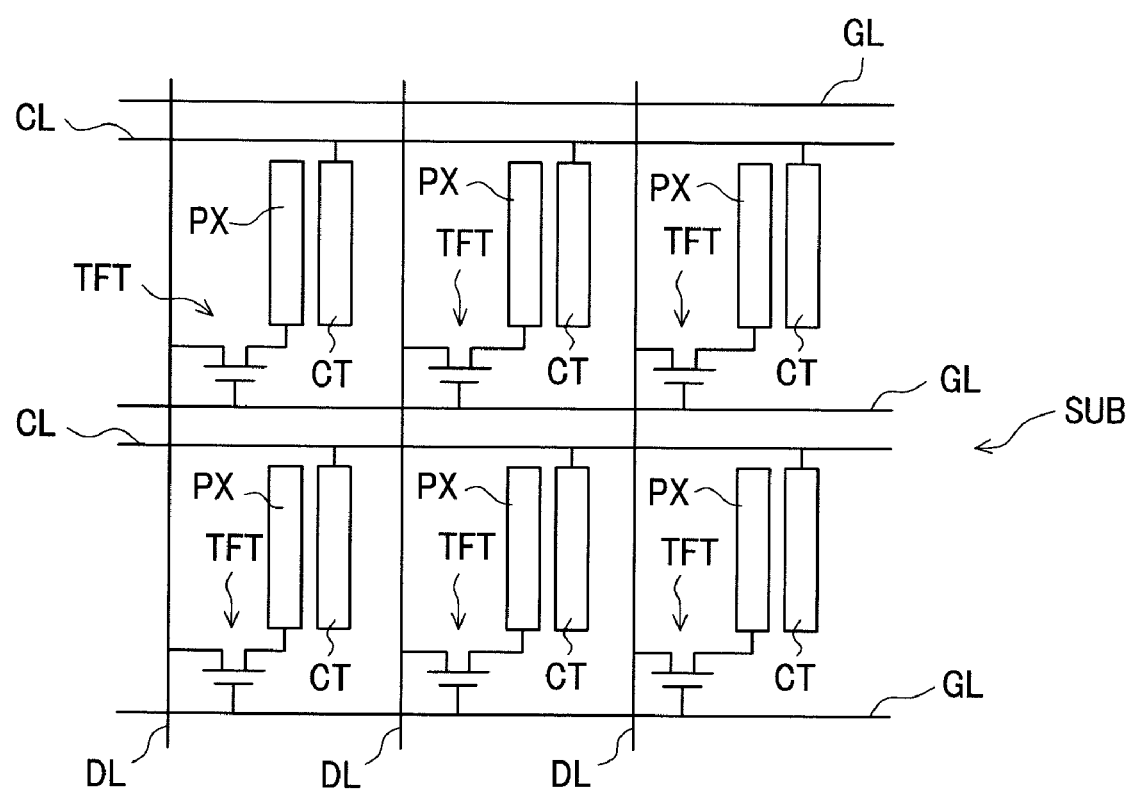
FIG. 1 is an equivalent circuit diagram of a TFT substrate which constitutes an IPS-type liquid crystal display device.
Figure 2:
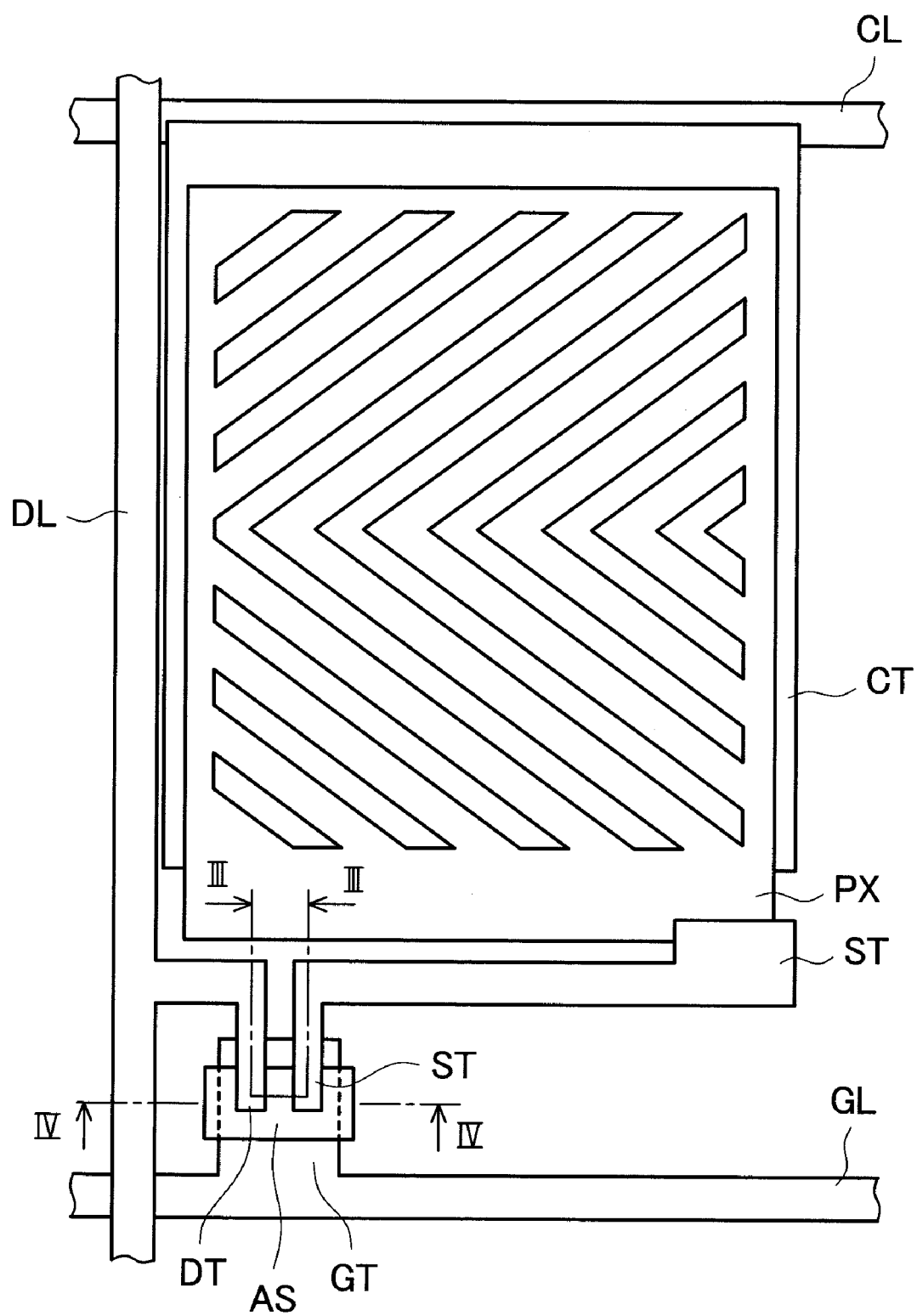
FIG. 2 is an enlarged plan view showing a state of a pixel on the TFT substrate according to a first embodiment.

FIG. 1 is a view showing an equivalent circuit of the TFT substrate SUB of the above-mentioned liquid crystal display device. FIG. 2 is an enlarged plan view showing a state of one pixel on the TFT substrate SUB in an enlarged manner.

In these drawings, on the TFT substrate SUB, a large number of scanning signal lines GL extend in the lateral direction in the drawing at equal intervals and, at the same time, a large number of video signal lines DL extend in the longitudinal direction in the drawing at equal intervals. Respective pixels which are arranged in a matrix array are defined by the scanning signal lines GL and the video signal lines DL. Further, reference signal lines CL extend in the lateral direction in the drawing parallel to the respective scanning signal lines GL. Around a region (pixel region) in which pixels are arranged in a matrix array, a scanning signal line drive circuit which supplies a scanning signal to the scanning signal lines GL and a video signal line drive circuit which supplies a video signal to the video signal lines DL are arranged.

The pixel region is formed by arranging the pixels which are defined by the scanning signal lines GL and the video signal lines DL in a matrix array. As shown in FIG. 2, at a corner of each pixel, a thin film transistor TFT having the MIS (Metal-Insulator-Semiconductor) structure is formed. A gate electrode GT of the thin film transistor TFT is connected to the scanning signal line GL, and a drain electrode DT of the thin film transistor TFT is connected to the video signal line DL. Further, in each pixel, a pair of electrodes consisting of a pixel electrode PX and a counter electrode CT is formed, wherein the pixel electrode PX is connected to a source electrode ST of the thin film transistor TFT, and the counter electrode CT is connected to the reference signal line CL.

In the above-mentioned circuit constitution, a reference voltage is applied to the counter electrodes CT of the respective pixels via the reference signal line CL, and a scanning signal is supplied to the scanning signal lines GL from the scanning signal line drive circuit sequentially so that a pixel row is selected. By allowing the video signal line drive circuit to supply a video signal to the respective video signal lines DL at timing when the pixel row is selected, a voltage of the video signal is applied to the pixel electrodes PX of the respective pixels. Accordingly, a lateral electric field having intensity corresponding to a voltage of the video signal is generated between the pixel electrode PX and the counter electrode CT and the alignment of liquid crystal molecules is determined correspondingly to the intensity of the lateral electric field.

Here, as shown in FIG. 2, the gate electrode GT is formed in an upwardly projecting manner from the scanning signal line GL in the drawing, and a rectangular semiconductor film AS is arranged such that the semiconductor film AS intersects with the gate electrode GT. Then, the drain electrode DT which is provided to the video signal line DL and the source electrode ST which is provided to the pixel electrode PX extend in the direction that the gate electrode GT projects and are electrically connected to the semiconductor film AS. The semiconductor film AS is formed into a planar shape, and includes a region where the semiconductor film AS overlaps with the gate electrode GT in plan view (hereinafter referred to as first region) and a region where the semiconductor film AS does not overlap with the gate electrode GT in plan view (hereinafter referred to as second region). The semiconductor film AS is not connected with the drain electrode DT and the source electrode ST in the second region, and is connected with the drain electrode DT and the source electrode ST in the first region.

Although an electric field is generated between the drain electrode DT and the gate electrode GT and between the source electrode ST and the gate electrode GT, the drain electrode DT and the source electrode ST are connected with each other in the first region and hence, portions where a gate-drain electric field of high intensity and a gate-source electric field of high intensity are generated respectively are shielded from light radiated from the backlight. Further, the second region of the semiconductor film AS is not shielded from light by the gate electrode GT and hence, a hole-electron pair is generated in the second region. However, the hole-electron pair is scarcely influenced by the gate-drain electric field or the like and hence, the hole-electron pair is recombined so that an optical leak current is scarcely observed as a drain current. Accordingly, even when the semiconductor film AS is formed such that a portion of the semiconductor film AS projects from the gate electrode GT, since the drain electrode DT and the source electrode ST are connected to the semiconductor film AS in the first region, the generation of the optical leak current can be suppressed whereby the required alignment accuracy of the semiconductor film AS can be alleviated.

The drain electrode DT and the source electrode ST are connected with each other in the first region where the gate electrode GT overlap with the semiconductor film AS while preventing overlapping thereof with the second region in plane. Further, by positioning the regions to which electric fields are applied due to the potential difference between the drain electrode DT and the gate electrode GT and between the source electrode ST and the gate electrode GT away from the second region where a hole-electron pair may be generated, it is possible to suppress the generation of an optical leak current.

Figure 3:
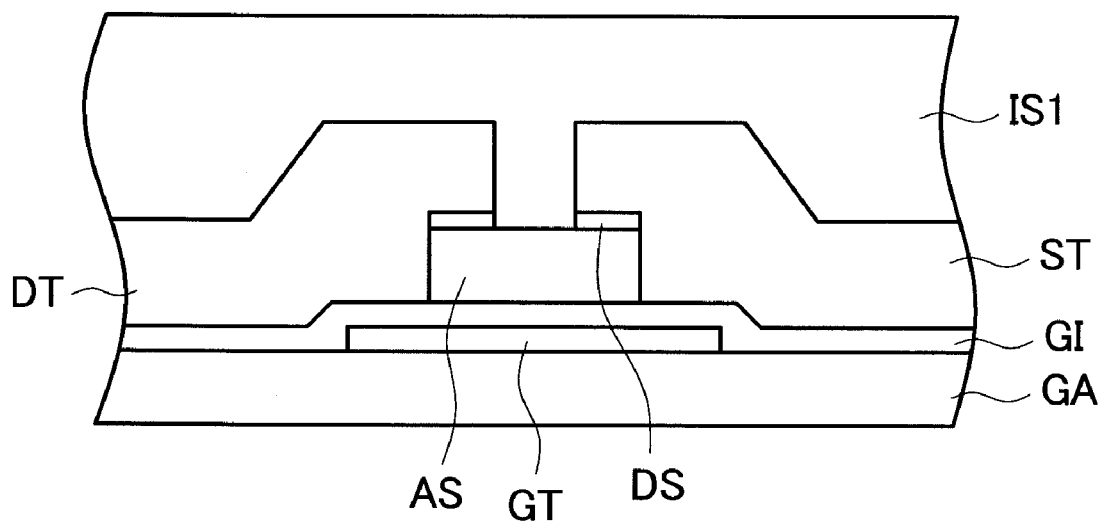
FIG. 3 is a cross-sectional view taken along a line in FIG. 2.

FIG. 3 is a cross-sectional view taken along a line III-III in FIG. 2. As shown in FIG. 3, in the thin film transistor TFT formed on the TFT substrate SUB, the semiconductor film AS is arranged above the gate electrode GT by way of a gate insulation film GI. Further, the drain electrode DT and the source electrode ST are formed on the gate insulation film GI and, at the same time, are stacked on the gate insulation film GI such that the drain electrode DT and the source electrode ST climb over the semiconductor film AS from sides. Ohmic contact layers DS are formed on the semiconductor film AS, and the ohmic contact layers DS are interposed between the source electrode ST and the semiconductor film AS and between the drain electrode DT and the semiconductor film AS respectively. The ohmic contact layer DS is, for example, formed of a film made of amorphous silicon doped with impurities, and is electrically connected with the line layer and the semiconductor layer such that a voltage-current characteristic at an electrically-contact portion between the line layer and the semiconductor layer exhibits the linearity. Further, the source electrode ST, the drain electrode DT and the like are covered with a protective insulation film IS1 from above.

Particularly, as shown in FIG. 2 and FIG. 3, the gate electrode GT includes extending portions which extend from the semiconductor film AS. As shown in FIG. 2, the extending portions are formed on an upper side and a lower side of the first region of the semiconductor film AS in the drawing (on both sides of the semiconductor film AS in the Y direction) respectively. Further, the extending portions do not overlap with the semiconductor film AS in plan view, and the source electrode ST and the drain electrode DT reach the first region after passing a region where these electrodes ST, DT overlap with the extending portion in plan view. Although there exists a possibility that a gate-drain (source) electric field is generated in areas in the vicinity of side surfaces of the semiconductor film AS where the source electrode ST and the drain electrode DT get over the semiconductor film AS, the areas in the vicinity of the side surfaces are shielded from light by the extending portions of the gate electrode GT and hence, it is possible to suppress the generation of an optical leak current. Further, as shown in FIG. 2, the drain electrode DT and the source electrode ST are formed such that the drain electrode DT and the source electrode ST extend along the gate electrode GT and overlap with the extending portion and the first region in plan view. The first region has a predetermined length in the Y direction and hence, the required accuracy in layout of the drain electrode DT and the source electrode ST in the extending direction can be alleviated.

Figure 4:
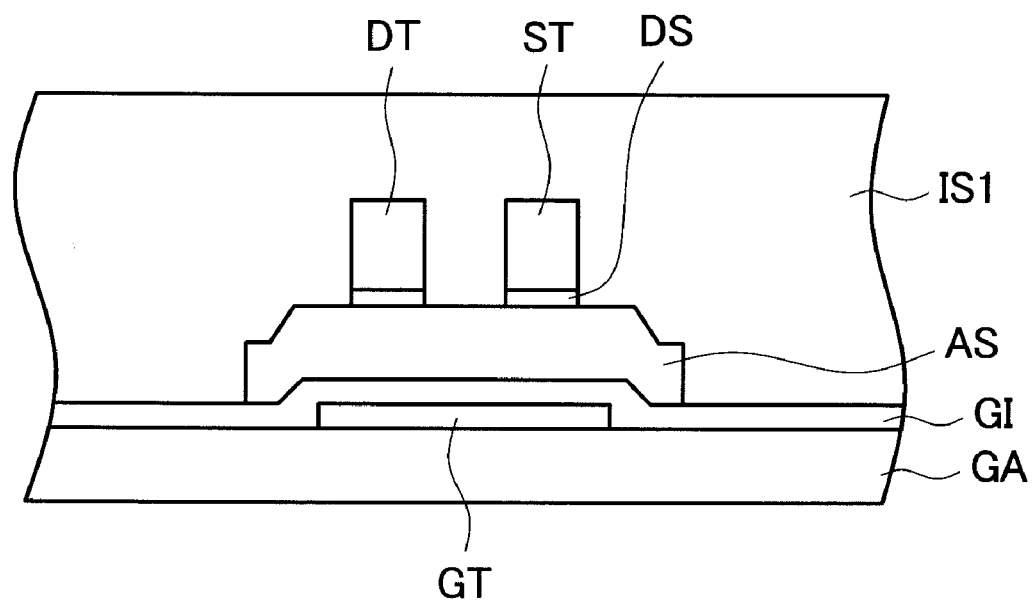
FIG. 4 is a cross-sectional view taken along a line IV-IV in FIG. 2.

FIG. 4 is a cross-sectional view taken along a line IV-IV in FIG. 2. In this embodiment, as shown in FIG. 4, since the gate electrode GT and the semiconductor film AS are formed such that the gate electrode GT and the semiconductor film AS intersect with each other in plan view, second regions where the semiconductor film AS is not shielded from light by the gate electrode GT are formed on both left and right sides respectively in the drawing in a state where the second regions sandwich the first region therebetween. However, the second region may be formed on one side. Further, although the extending portions of the gate electrode GT are formed so as to sandwich the first region therebetween as shown in FIG. 2, the extending portion may be formed on only one side. For example, when the extending portion of the gate electrode GT exists only on a scanning signal line GL side, the source electrode ST and the drain electrode DT extend to the first region of the semiconductor film AS from the scanning signal line GL side in an overlapping manner with the extending portion in plan view. Here, when the extending portions are formed so as to sandwich the first region therebetween as in the case of this embodiment, the drain electrode DT and the source electrode ST reach the first region from a region where the drain electrode DT and the source electrode ST overlap with one extending portion and, further, the drain electrode DT and the source electrode ST may extend to a region where the drain electrode DT and the source electrode ST overlap with the other extending portion and hence, it is possible to alleviate the required accuracy in layout.

In this embodiment, as shown in FIG. 2, the gate electrode GT is formed in a projecting manner in the upward direction which becomes the Y direction in the drawing perpendicular to the X direction from the scanning signal line which is formed in the X direction in the drawing. Further, the source electrode ST and the drain electrode DT extend downward in the drawing toward a scanning signal line GL side along the gate electrode GT from a position upwardly away from an end portion of the gate electrode GT while overlapping with the gate electrode GT in plan view. Here, the semiconductor film AS includes the first region where the semiconductor film AS overlaps with the gate electrode GT in plan view and the second regions where the semiconductor film AS does not overlap with the gate electrode GT in plan view. The source electrode ST and the drain electrode DT are electrically connected with the semiconductor film AS in the first region via the ohmic contact layers. The semiconductor film AS, the source electrode ST and the drain electrode DT are formed in contact with the gate insulation film GI. Further, the source electrode ST and the drain electrode DT reach and are connected to the first region via a region which overlaps with the gate electrode GT and does not overlap with the semiconductor film AS (a region where the source electrode ST and the drain electrode DT overlap with the extending portion in plane) while obviating the second regions.

In this embodiment, the semiconductor film AS has a rectangular shape as shown in FIG. 2. However, the semiconductor film AS may have other shapes such as an L shape. The gate electrode GT also may extend from the scanning signal line GL and may be formed into other shapes such as an L shape. Further, the gate electrode GT may not be projected from the scanning signal line GL, and a portion of the scanning signal line GL may function as the gate electrode GT. Even when the semiconductor film AS and the gate electrode GT have another shape, it is sufficient that the source electrode ST and the drain electrode DT are connected with the semiconductor film AS in the first region. Further, when the source electrode ST and the drain electrode DT are stacked so as to get over the semiconductor film AS from sides as shown in FIG. 3, it is sufficient that the source electrode ST and the drain electrode DT are connected with the semiconductor film AS in the first region via the region where the source electrode ST and the drain electrode DT overlap with the extending portion of the gate electrode GT in plan view while avoiding the overlapping thereof with the second region.

Heretofore, the constitution of the thin film transistor TFT according to this embodiment has been explained. Hereinafter, a method for manufacturing the thin film transistor TFT is explained in conjunction with FIG. 5A to FIG. 5E.

Figure 5A:
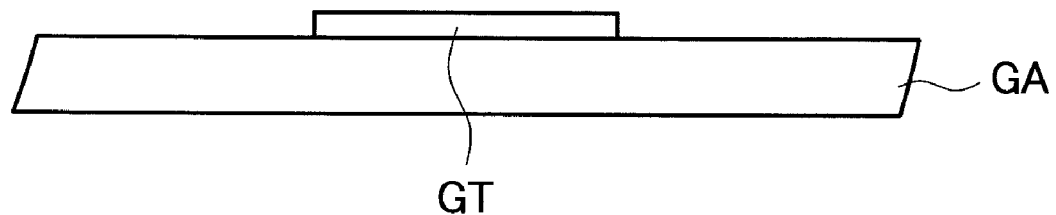
FIG. 5A to FIG. 5E are views showing a mode of manufacturing a thin film transistor TFT of the display device according to the first embodiment.

Firstly, the gate electrodes GT are formed on a transparent substrate GA such as a glass substrate (FIG. 5A). The gate electrodes GT are formed using conductive metal such as molybdenum, for example, and are formed into a shape shown in the drawing through a known photolithography step and a known etching step. Further, a silicon nitride (SiN) film may be formed on the transparent substrate GA by a CVD method, for example, so as to form a contamination preventing film.

Figure 5B:
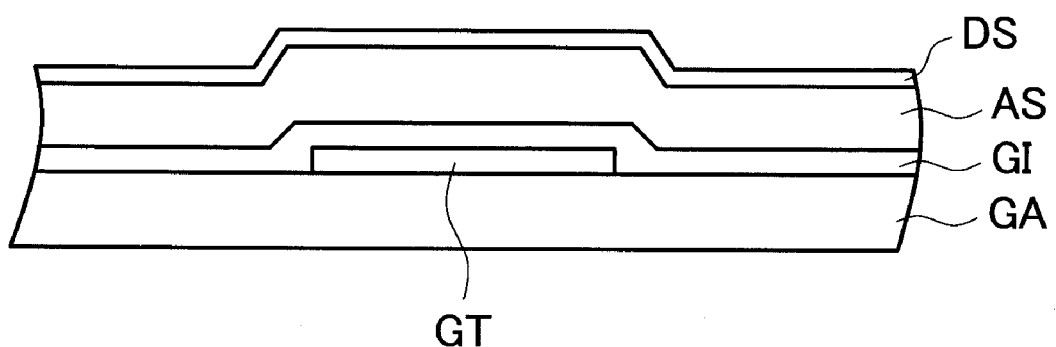

Next, the gate insulation film GI is formed so as to cover the gate electrodes GT and, at the same time, the semiconductor films AS and the ohmic contact layers DS are formed on the gate insulation film GI (FIG. 5B). The gate insulation film GI is made of silicon dioxide, for example, and is formed by a CVD method. The semiconductor films AS are made of amorphous silicon and are formed by a CVD method and, further, the ohmic contact layers DS are stacked on the semiconductor film AS while adding impurities such as phosphorus to amorphous silicon at high concentration.

Although the semiconductor film AS of this embodiment is made of amorphous silicon, the semiconductor film AS may be made of crystalline silicon such as micro-crystalline silicon (μc-Si) and poly-crystalline silicon. Amorphous silicon is crystallized into crystalline silicon using laser annealing, an RTA (Rapid Thermal Anneal) method or the like. In general, along with the enhancement of crystallinity of silicon in the semiconductor film AS, a crystal size is increased so that the electron mobility is enhanced. On the other hand, a required process temperature is elevated to a high temperature and hence, a process cost is pushed up. Here, a crystal particle size of micro-crystalline silicon falls within a range from approximately 10 nm to 100 nm, and a crystal particle size of poly-crystalline silicon is set to approximately 100 nm or more. These crystal particle sizes are confirmed by a reflection electron diffraction method, a Raman spectroscopy method or the like.

Figure 5C:
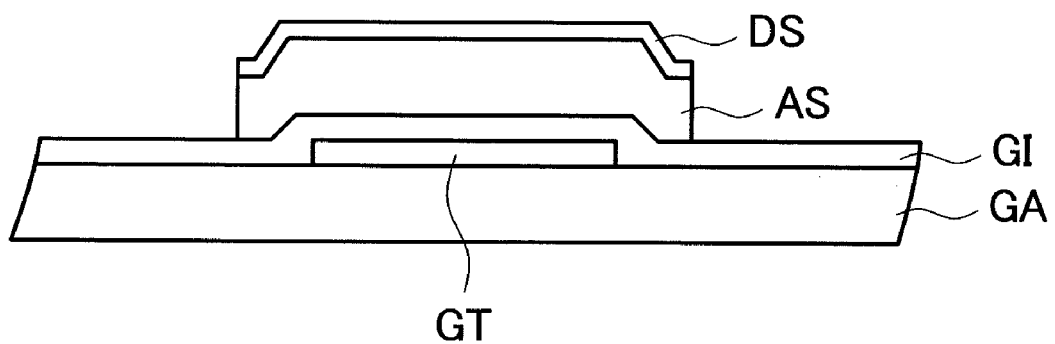
Figure 5D:
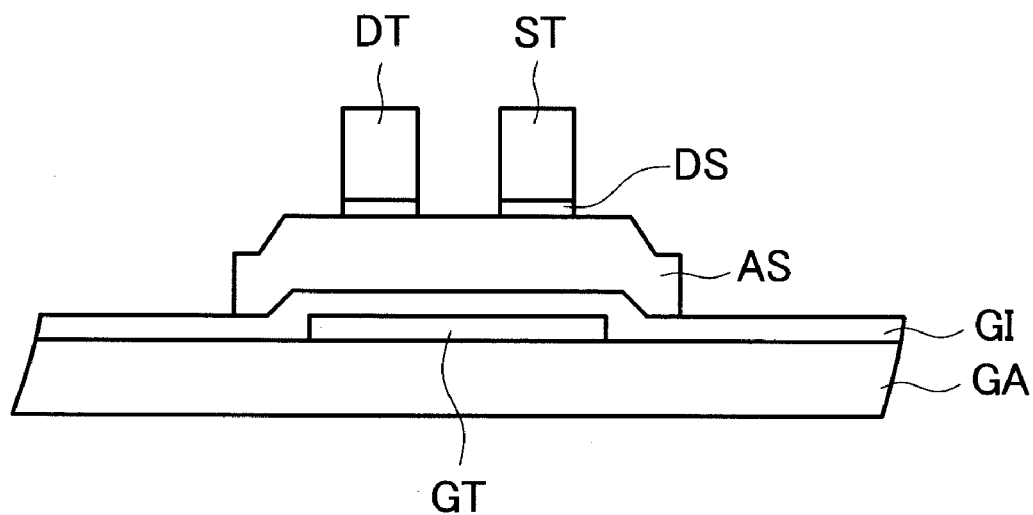
Figure 5E:
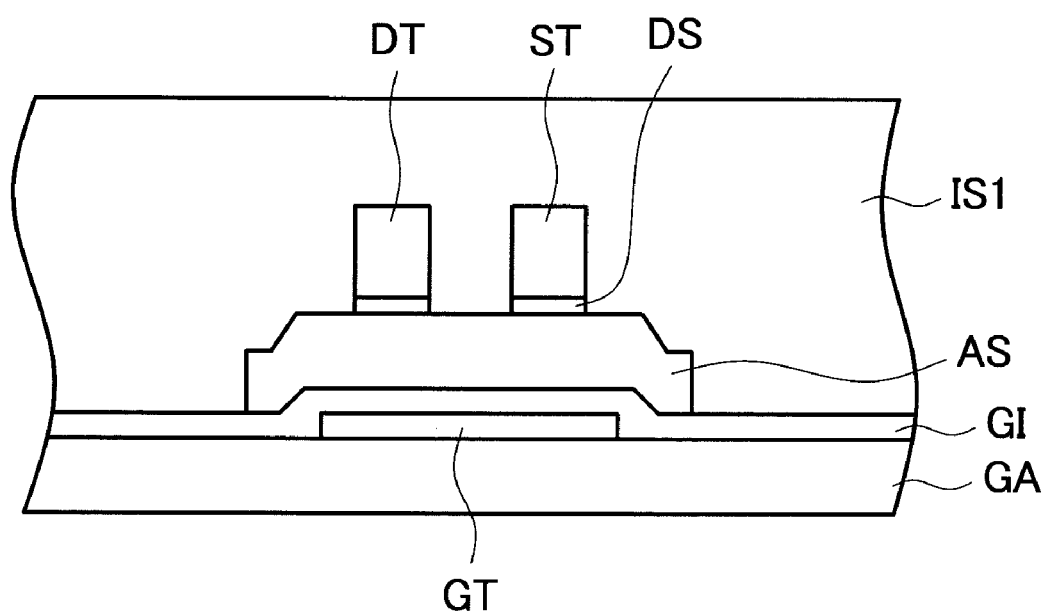

Further, the semiconductor films AS and the ohmic contact layers DS are formed into shapes shown in the drawing through a photolithography step and an etching step (FIG. 5C). Thereafter, a metal film which is used for forming the drain electrodes DT and the source electrodes ST is formed. The drain electrodes DT and the source electrodes ST are formed by sputtering using aluminum or an aluminum containing alloy as a material, and shapes of the source electrode ST and the drain electrode DT are formed respectively through a photolithography step and an etching step (FIG. 5D). Here, a barrier metal layer or a cap metal later may be formed on the source electrode ST and the drain electrode DT so as to protect the line layers made of aluminum or the like. Here, the barrier metal layer MB and the cap metal layer MC are formed of, for example, a conductive metal thin film made of metal having a high melting point such as titanium, tungsten, chromium or molybdenum. Then, the protective insulation film IS1 made of silicon nitride is formed on the whole structure by a plasma CVD method (FIG. 5E) and, thereafter, other structures such as pixel electrodes are formed.

In this embodiment, the semiconductor film AS is made of amorphous silicon and also has a predetermined thickness. The semiconductor film AS may be partially eroded at the time of performing etching for forming the source electrode ST and the drain electrode DT (FIG. 5D). Further, an insulation film which functions as an etching stopper film may be arranged on the semiconductor film AS.

The display device according to the embodiment of the invention which has been explained heretofore is not limited by the above-mentioned embodiment, and the invention may be carried out in other modes without departing from the technical concept of the invention.

[Second Embodiment]

In the above-mentioned first embodiment, as shown in FIG. 2, the gate electrode GT is formed at a position away from the video signal line DL on a right side in the drawing, and the drain electrode DT is formed in a rightwardly projecting manner from the video signal line DL in the drawing. The drain electrode DT which projects from the video signal line DL is bent so as to extend along the gate electrode GT and is connected to the first region of the semiconductor film AS after passing the extending portion of the gate electrode GT. However, the second embodiment differs from the first embodiment with respect to a point that an area where a gate electrode GT and a video signal line DL overlap with each other in plan view is provided, and the video signal line DL is connected with the first region of the semiconductor film AS as a drain electrode DT. Although the second embodiment is explained hereinafter, the explanation of the constitutions which are substantially equal to the constitutions of the first embodiment is omitted.

Figure 6:
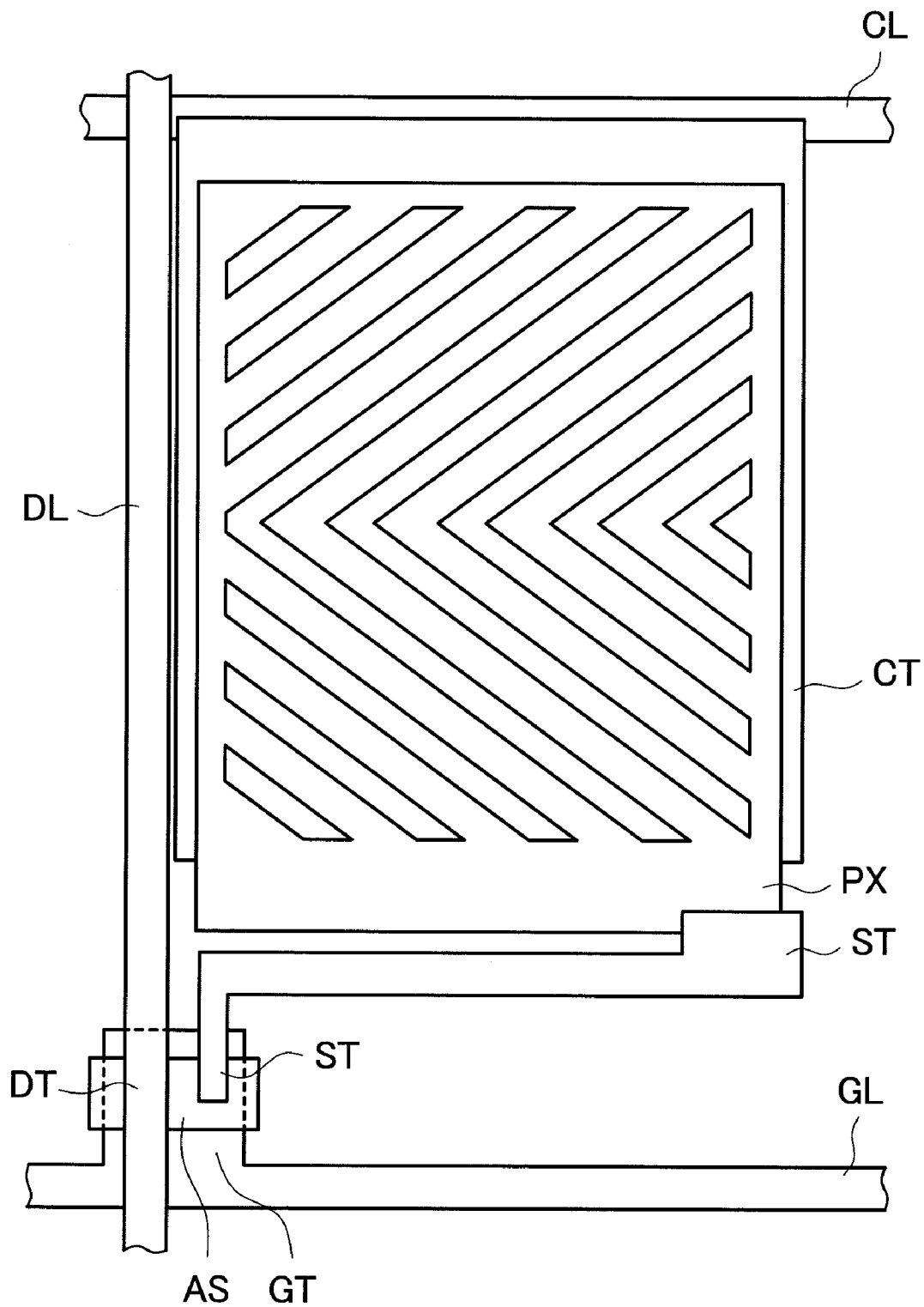
FIG. 6 is an enlarged plan view showing a state of a pixel on the TFT substrate according to a second embodiment.

FIG. 6 is an enlarged plan view showing a state of a pixel on a TFT substrate according to the second embodiment. As shown in FIG. 6, the video signal line DL includes a portion where the video signal line DL overlaps with the gate electrode GT and the semiconductor film AS in plan view, and a portion of the video signal line DL constitutes the drain electrode DT. The video signal line DL (drain electrode DT) is connected with the semiconductor film AS in the first region where the semiconductor film AS and the gate electrode GT overlap with each other in plan view. As shown in FIG. 6, the semiconductor film AS is formed such that the first region is sandwiched between extending portions of the gate electrode GT in plan view in the Y direction (extending direction of the video signal line DL). Accordingly, the video signal line DL is connected with the first region from both upper and lower sides in the Y direction in the drawing and also extends to the first region after passing the extending portion of the gate electrode GT. In the second embodiment, the drain electrode DT does not project from the video signal line DL and the gate electrode GT and the video signal line DL overlap with each other so that a numerical aperture of the pixel is enhanced. plan view. As shown in FIG. 6, the semiconductor film AS is formed such that the first region is sandwiched between extending portions of the gate electrode GT in plan view in the Y direction (extending direction of the video signal line DL). Accordingly, the video signal line DL is connected with the first region from both upper and lower sides in the Y direction in the drawing and also extends to the first region after passing the extending portion of the gate electrode GT. In the second embodiment, the drain electrode DT does not project from the video signal line DL and the gate electrode GT and the video signal line DL overlap with each other so that a numerical aperture of the pixel is enhanced.

As shown in FIG. 6, the gate electrode GT projects along the video signal line DL with a width larger than a width of the video signal line DL from a position where the scanning signal line GL and the video signal line DL intersect with each other. Further, the semiconductor film AS is formed so as to intersect with the gate electrode GT and the video signal line DL. However, for example, the gate electrode GT may be configured such that the gate electrode GT projects from the scanning signal line GL at a position away from the video signal line DL on one side and is bent toward the video signal line DL side such that the video signal line DL and the gate electrode GT overlap with each other. Further, although the semiconductor film AS is formed so as to intersect with the gate electrode GT and the video signal line DL, in the same manner as the first embodiment, the semiconductor film AS is formed so as to have a first region where the semiconductor film AS overlaps with the gate electrode GT in plane and a second region where the semiconductor film AS does not overlap with the gate electrode GT in plan view. Further, even when the video signal line DL and the semiconductor film AS do not overlap with each other, it is sufficient that the video signal line DL partially overlaps with the semiconductor film AS in the first region. In FIG. 6, the video signal line DL gets over the semiconductor film AS from an upper side and a lower side in the Y direction in the drawing and is connected to the first region of the semiconductor film AS. However, for example, the semiconductor film AS may be formed such that the video signal line DL gets over the semiconductor film AS from three sides, that is, both sides in the Y direction and a left side in the X direction and is connected to the first region of the semiconductor film AS. In such a case, the extending portions of the gate electrode GT are formed on three sides of the first region of the semiconductor film AS (both sides in the Y direction in the drawing and left side in the X direction in the drawing).

Figure 7:
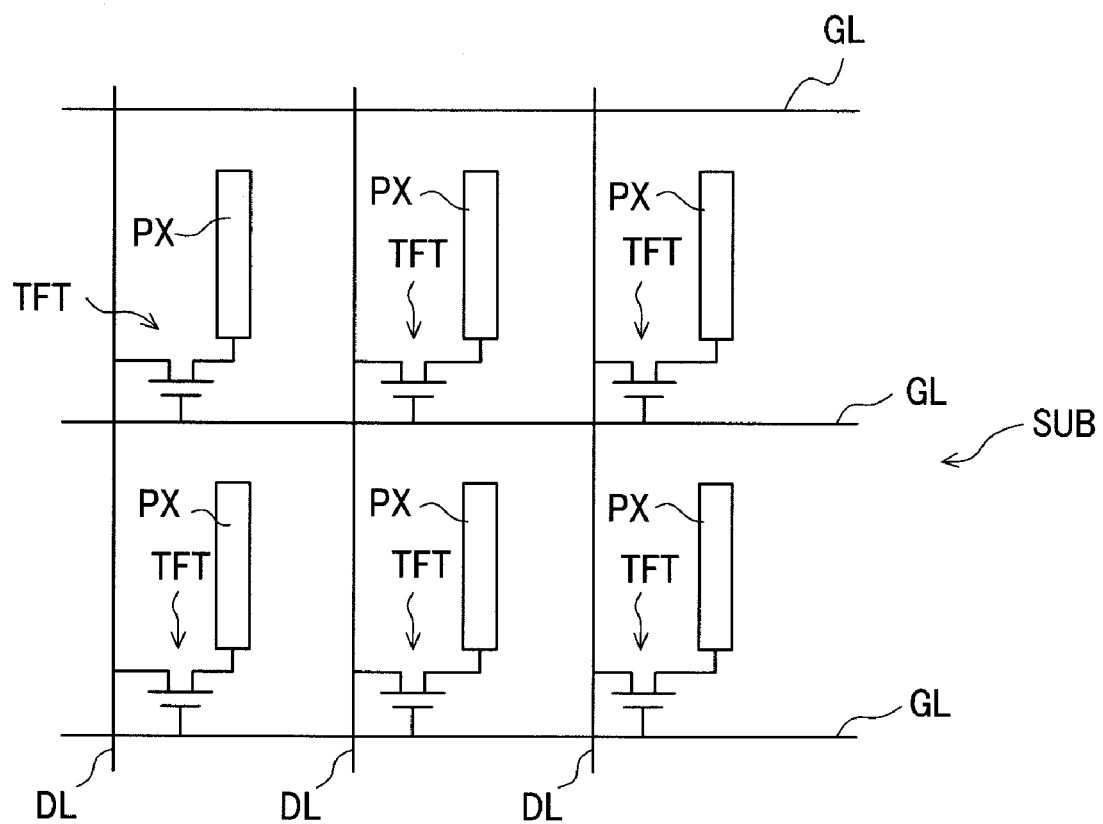
FIG. 7 is a view showing one example of an equivalent circuit of a TFT substrate which constitutes a VA-type or a TN-type display device.
Figure 8:
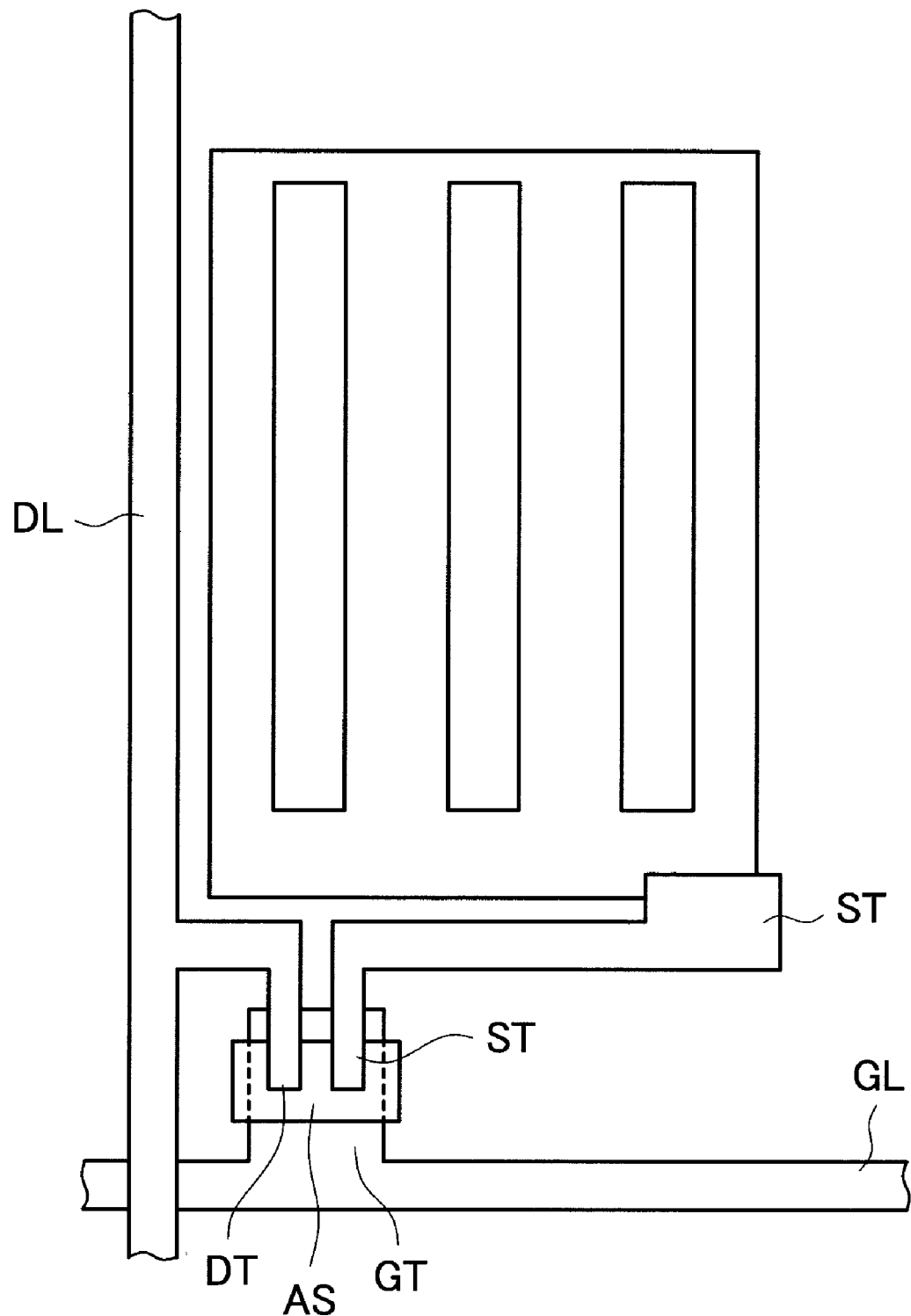
FIG. 8 is an enlarged plan view showing one example of a pixel which is formed on a VA-type or a TN-type TFT substrate.
Figure 9A:
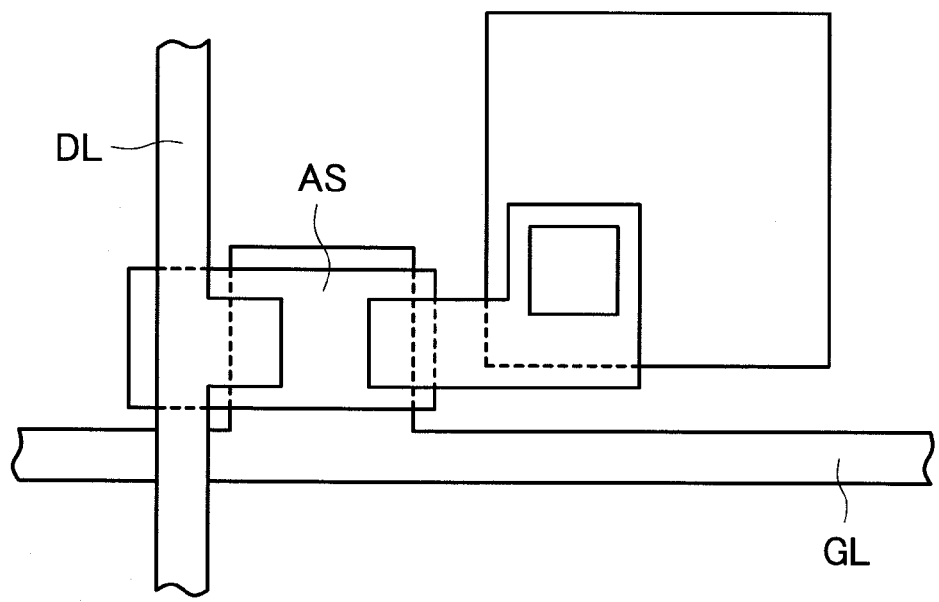
FIG. 9A is a plan view showing one example of a conventional thin film transistor.
Figure 9B:
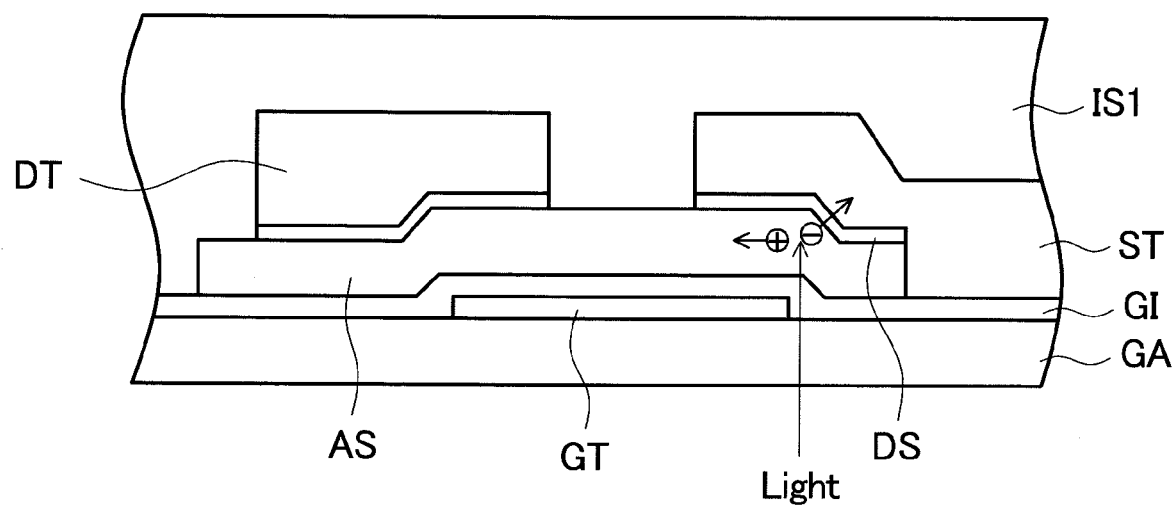
FIG. 9B is a cross-sectional view of the thin film transistor in FIG. 9A.
Figure 10A:
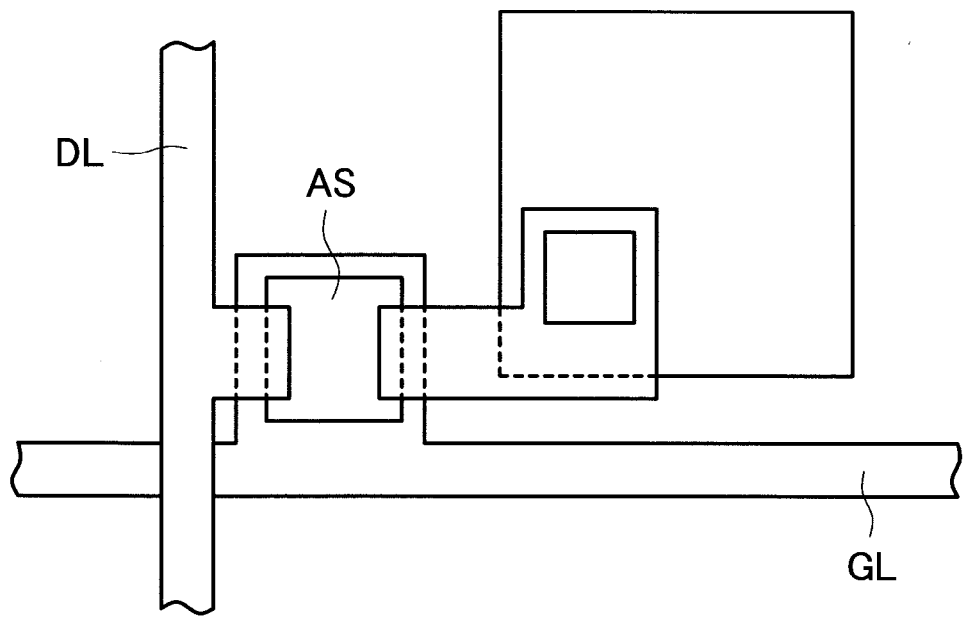
FIG. 10A is a plan view showing one example of a conventional thin film transistor.
Figure 10B:
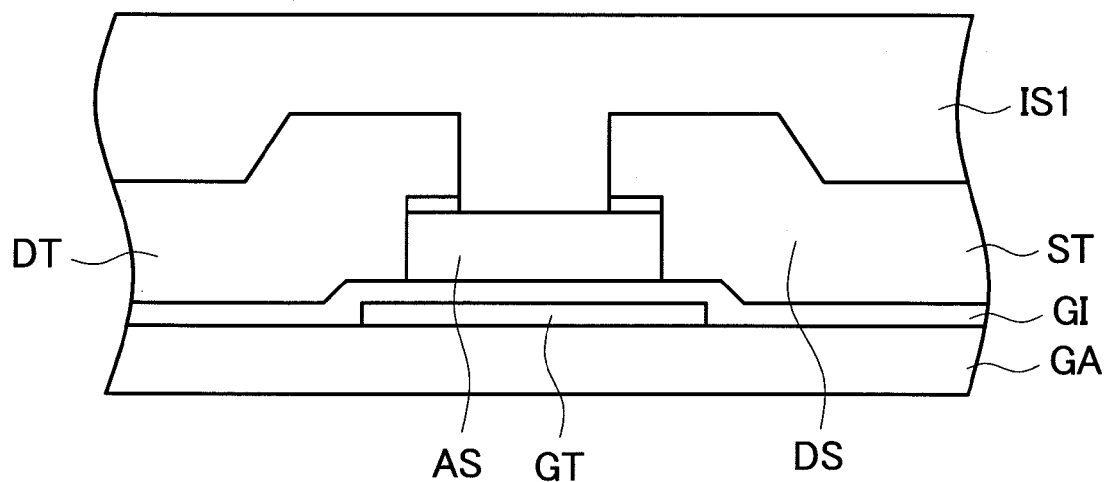
FIG. 10B is a cross-sectional view of the thin film transistor in FIG. 10A.

Here, the liquid crystal display devices according to the above-mentioned respective embodiments adopt an IPS method as a drive method for driving liquid crystal. However, the invention may adopt other drive method such as a VA (Vertically Aligned) method or a TN (Twisted Nematic) method. FIG. 7 is a view showing an equivalent circuit of a TFT substrate SUB which constitutes a VA-method or a TN-method display device, and FIG. 8 is an enlarged plan view showing one pixel on the TFT substrate SUB of the display device which adopts these methods. In case of the VA-method and the TN-method display device, instead of mounting the counter electrodes CT and the reference signal lines CL on the TFT substrate SUB, counter electrodes CT are mounted on a counter substrate which faces the TFT substrate SUB in an opposed manner and on which color filters are mounted.

The display devices according to the respective embodiments of the invention which have been explained heretofore are not limited by the above-mentioned embodiments, and the invention may be carried out in different modes without departing from the technical concept of the invention.

What is claimed is:

1. A liquid crystal display device having thin film transistors comprising:
    a transparent substrate;
    gate electrodes which are stacked above the transparent substrate;
    source electrodes and drain electrodes which are stacked above the gate electrodes; and
    semiconductor films each of which is stacked above the gate electrode and controls an electric current between the source electrode and the drain electrode based on an electric field generated by the gate electrode; wherein
    the semiconductor film is formed into a planar shape, and includes a first region where the semiconductor film overlaps with the gate electrode in plan view and a second region where the semiconductor film does not overlap with the gate electrode in plan view,
    the source electrode and the drain electrode are not connected to the semiconductor film in the second region, and are connected to the semiconductor film in the first region,
    a gate insulation film is stacked between the gate electrode and the semiconductor film,
    the semiconductor film is stacked above the gate insulation film in a contact manner, and
    the source electrode and the drain electrode are stacked above the gate electrode such that the source electrode and the drain electrode are brought into contact with the gate insulation film and climb over the semiconductor film from one side of the semiconductor film.

2. The liquid crystal display device according to claim 1, wherein the gate electrode includes an extending portion that does not overlap with the semiconductor film in plan view, the extending portion extending from a portion of the gate electrode that overlaps the first region in plan view, and
    the source electrode and the drain electrode are connected to the semiconductor film in the first region by way of a region where the source electrode and the drain electrode overlap with the extending portion in plan view.

3. The liquid crystal display device according to claim 2, wherein the source electrode and the drain electrode extend along the gate electrode and overlap with the extending portion and the first region in plan view.

4. The liquid crystal display device according to claim 3, wherein the gate electrode is formed in a projecting manner in the Y direction perpendicular to the X direction from a gate signal line which is formed in the X direction and to which a scanning signal is supplied,
    the extending portion further extends from a portion of the gate electrode which overlaps with the first region of the semiconductor film in the direction where the gate electrode projects, and
    the source electrode and the drain electrode extend toward the gate electrode from a position which is more away from an end portion of the gate electrode in the direction that the gate electrode projects, and overlap with the extending portion and the first region in plan view.

5. The liquid crystal display device according to claim 3, wherein the liquid crystal display device further comprises:
    gate signal lines which are formed in the X direction and to which a scanning signal is supplied; and
    drain signal lines which are formed in the Y direction perpendicular to the X direction and to which a video signal is supplied, the drain electrode constitutes a portion of the drain signal line, and the drain signal line has a portion which overlaps with the gate electrode and the semiconductor film in plan view, the first region of the semiconductor film is sandwiched in plan view by the extending portion on one side, and by a separate portion of the gate electrode on another side, and the drain signal line extends to the first region of the semiconductor film from both sides in the Y direction, and has a portion thereof connected to the semiconductor film.

6. The liquid crystal display device according to claim 1, wherein a backlight is arranged below the transparent substrate, the first region is shielded from light radiated from the backlight by the gate electrode, and a region to which an electric field is applied due to a potential difference between the source electrode and the gate electrode and between the drain electrode and the gate electrode is positioned away from the second region which is not shielded from light radiated from the backlight.

7. The liquid crystal display device according to claim 1, wherein the source electrode and the drain electrode are connected to the semiconductor film in the first region while preventing the source electrode and the drain electrode from overlapping with the second region in plan view.

* * * * *